United States Patent [19]

Raadsen

[11] 4,420,698

[45] Dec. 13, 1983

[54] PEAK DETECTOR

[75] Inventor: Johannes F. A. Raadsen, Enschede, Netherlands

[73] Assignee: U.S. Philips Corporation, New York, N.Y.

[21] Appl. No.: 236,358

[22] Filed: Feb. 20, 1981

[30] Foreign Application Priority Data

Feb. 29, 1980 [NL] Netherlands ......................... 8001234

[51] Int. Cl.³ ....................... H03K 5/153; G01R 19/04
[52] U.S. Cl. .................................... 307/351; 307/359; 328/151
[58] Field of Search ....................... 307/351, 358, 359; 328/151

[56] References Cited

U.S. PATENT DOCUMENTS 3,828,260  8/1974  Underwood ..................... 307/351
3,852,617 12/1974  Vidovic ........................... 307/351

Primary Examiner—John Zazworsky
Attorney, Agent, or Firm—Robert T. Mayer; Bernard Franzblau

[57] ABSTRACT

The bandwidth of an accurate peak detector may be extended considerably in the direction of the high frequencies if one transistor (6) is arranged as a voltage comparator and constitutes the only high-frequency amplifying element in the peak detector. Two capacitors (4,8) carry the high-frequency currents and serve as direct voltage stores which are included in a direct voltage control circuit (10,11,12,16).

9 Claims, 4 Drawing Figures

PEAK DETECTOR

The invention relates to a peak detector comprising a first capacitor operative as a storage element, a charging circuit coupled to said capacitor, and a voltage comparator circuit which compares the input voltage of the peak detector with the voltage across the first capacitor and which controls the charge of said capacitor in a compensating sense if the capacitor voltage is not directly proportional to the input-voltage peak-value to be measured.

Such a peak detector is known from the article by J. Hawke in the magazine "Electronic Engineering", vol. 49, mid-October, 1977, page 23, "Low offset peak detector circuit uses transistors".

This article mentions the problem of the offset voltage which appears in peak detectors equipped with a diode. This problem can largely be solved by including the diode in a feedback circuit of an operational amplifier. A drawback of this solution is that the amplifier has a limited bandwidth so that high-frequency signals outside the band cannot be measured accurately.

The article proposes a circuit using transistors which comprises few components and yet has a high gain factor. It is found that this yields an increased bandwidth. The aforementioned operational amplifier has been replaced by a differential amplifier comprising two transistors connected in a long-tailed pair arrangement with a current mirror in the collector circuits. This voltage comparator circuit compares the applied input voltage with the voltage across a capacitor, which serves as a storage element. If this last-mentioned voltage is not equal to the peak value of the input voltage, the charge on the capacitor is controlled by a charging circuit. The charging circuit comprises a discharge resistor and a current-source arrangement which is connected to one of the collectors of the amplifier transistors.

Both the peak detector with an op.amp. and the peak detector described in the foregoing carry high-frequency currents throughout the circuit up to the storage capacitor, each time that the high-frequency input voltage has substantially reached its peak value. However, each amplifying element in the circuit limits the overall frequency response owing to its falling frequency response curve.

The invention is based on the reasoning that it is alternatively possible to employ one transistor as a voltage comparator circuit, which is consequently the sole high-frequency amplifying element in the peak detector.

A peak detector of the type mentioned in the preamble is therefore characterized in that the voltage comparator circuit is constituted by a transistor of which either the base or the emitter electrode is connected to a first input terminal of the peak detector. Furthermore, the other one of said base and emitter electrodes is connected to the first capacitor and the collector is connected to a second capacitor. The two capacitors are coupled to the second input terminal, which is also connected to ground. The charging circuit comprises an amplifier arrangement provided with a high-ohmic input which is connected to the collector and to a current-source arrangement, and with an output which is connected to the output of the peak detector and to the other one of said base and emitter electrodes.

The advantage of such a peak detector is that a very large bandwidth is obtained, whose so-called 3-dB points can readily be adjusted on the low frequency side to a few Hz, determined by the current-source arrangement and the second capacitor, and on the high frequency side to a frequency which is of the order of magnitude of the so-called transition frequency ft, i.e. the frequency at which the current gain factor $h_{fe}$ of the transistor has become unity.

This high-frequency -3dB point is in fact determined by the high-frequency equivalent diagram of the transistor, for which especially the base series-resistance $r_{bb}$ is of importance, and furthermore by the quality of the capacitors, the lay-out of the components and the amplitude of the input signal.

In this peak detector the high-frequency currents mentioned in the foregoing only flow in the input circuit through the transistor and through the two capacitors. Said amplifier arrangement is too slow to respond. However, this arrangement and the current-source arrangement do provide the d.c. setting of the detector and thus the direct voltages on the two capacitors, i.e. the criterion of the peak value to be measured. For very low frequencies and for direct voltage the entire circuit constitutes a self-adjusting feedback system.

The peak detector in accordance with the invention may be adapted so that in an absolute sense the lowest value of a signal or the highest value of a signal is represented by a direct voltage. The input signals may be sinusoidal, comprise a direct voltage, be pulse-shaped, as the case may be with a very low duty-cycle, or have an arbitrary shape.

For measuring the peak value of small signals it is desirable to eliminate the influence of the base-emitter voltage. For this purpose, an embodiment of the invention is characterized in that the connection of said output to the other one of said base and emitter electrodes includes a first resistor which is included between said electrode and the junction point of an adjustable voltage divider, which in turn is connected in parallel circuit with a diode. This parallel circuit has one end is connected to the output and the other end to a first reference voltage by means of a second resistor. The diode is thus forward-biased so as to compensate for the influence of the base-emitter voltage on the peak-value measurement.

The transistor of the invention may be connected in common-base or in common-emitter arrangement.

In the common-base arrangement the measuring signal is applied to the emitter and the amplifier arrangement functions as an impedance transformer. The circuit arrangement measures negative peak values if the transistor is of the npn-type and measures positive peak values if the transistor is of the pnp-type.

In the common-emitter arrangement the measuring signal is applied to the base. The amplifier arrangement should shift the signal at the high-ohmic input by 180° before it is applied to the emitter. For this purpose one embodiment incorporates a differential amplifier in an inverting negative-feedback circuit. The high ohmic input of the amplifier arrangement is provided by a buffer amplifier.

In another embodiment using the common-emitter arrangement the amplifier arrangement includes an integrator whose non-inverting input is connected to a reference voltage and whose inverting input is connected to the collector of the transistor and to the integrator capacitor.

In the common-emitter arrangement the second capacitor may alternatively be included between the collector and the emitter of the transistor. Bu suitably dimensioning the two capacitors in respect of the gain factor of the transistor, the voltage at the collector of the transistor will also be free of ripple at the high frequencies.

The mentioned transistor may be a field-effect transistor having its gate, source and drain electrodes connected in the same manner as the base, emitter and collector electrodes, respectively.

The invention will be described in more detail with reference to the drawing. In the drawing.

Figure 4:
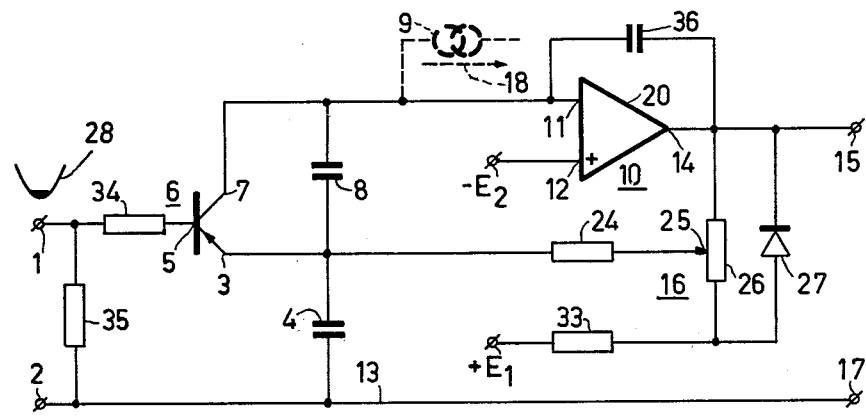

FIG. 4 a common-emitter pnp-embodiment with an integrator.

Figure 1:
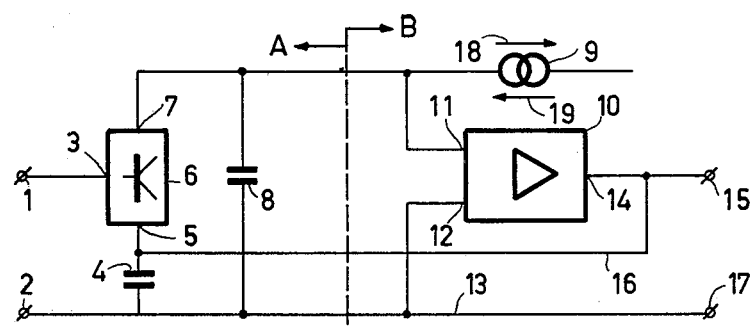
FIG. 1 represents a block diagram of the invention.

FIG. 1 represents a block diagram of the peak detector. Section A represents the section in which the high-frequency currents flow for high-frequency input signals and section B represents the low-frequency section providing the d.c. negative feedback of the arrangement in accordance with the invention.

The signal, whose positive or negative peak value is to be measured, is applied to the first input terminal 1 and to the second input terminal 2, which is also connected to the circuit ground. Terminal 1 is connected to the one electrode 3 of the transistor 6. Via the first capacitor 4, terminal 2 is connected to the other electrode 5 of the base and emitter electrodes of transistor. The collector 7 of this transistor is connected to terminal 2 via the second capacitor 8.

A current source arrangement 9 supplies a current either to the transistor 6 or the capacitor 8. When the transistor is cut off, capacitor 8 is charged and the voltage across the capacitor increases in an absolute sense. This voltage is measured by means of an amplifier arrangement 10 having a high-ohmic input 11, which arrangement is represented as a block. The reference input 12 is connected to the ground connection 13. The output 14 is connected to the output terminal 15 of the peak detector and moreover to the electrode 5 and the capacitor 4 by means of a connection 16. The other output terminal 17 of the peak detector is connected to ground connection 13.

The operation of the circuit arrangement will be such that when transistor 6 is cut off the base-emitter diode between points 3 and 5 will be turned on after a period of time that is dependent upon the charging time constant of capacitor 8, the delay in amplifier 10, and the time constant of the connection (circuit means) between output 14 of the amplifier and the capacitor 4. At this instant the transistor can carry collector current. It will be evident that the transistor 6 will be of the pnp-type if the current-source arrangement supplies a current in accordance with the arrow 18 and that the transistor will be of the npn-type if the current flows in accordance with the arrow 19.

By way of example the following is assumed: the transistor is of the pnp-type so that the current flows in accordance with the arrow 18. When the transistor is cut off, capacitor 8 is charged in a negative sense. Furthermore, it is assumed that the positive peak is to be detected. The base-emitter diode should then be turned on at positive peak values of the input signal. Point 3 will then be the emitter and point the base. If the transistor is cut off, the voltage across capacitor 4 should decrease. The amplifier arrangement 10 should consequently have a positive gain factor. The other three cases which are possible will be discussed with reference to FIGS. 2, 3 and 4.

Figure 2:
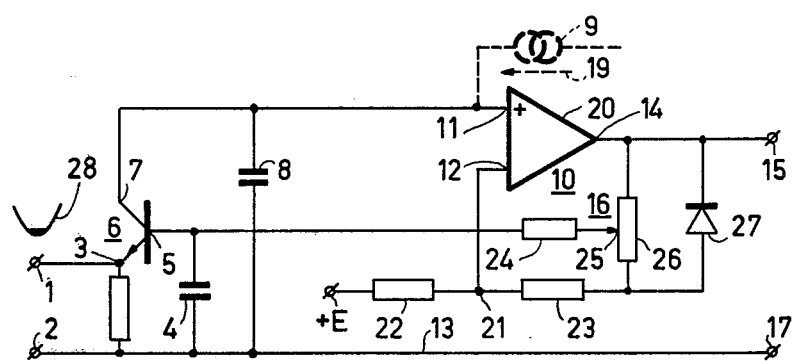
FIG. 2 represents a common-base npn-embodiment.

FIG. 2 represents a detector for negative peak values employing an npn-transistor 6 in common-base arrangement. The current-source arrangement 9 with the arrow 19 indicating the current direction is shown dashed because it is found that instead of this arrangement it is possible to employ the bias current of the first stage of the amplifier arrangement, i.e. the current supplied by input 11. The value of this current for type LM 324 is for example 50 nanoamps. The amplifier arrangement 10 comprises the differential amplifier 20 with a high-ohmic non-inverting input 11, and an input 12 which is connected to the junction point 21 of the voltage divider 22, 23. The voltage divider is included between output 14 of amplifier 20 and a second reference voltage +E. This reference voltage ensures that the collector voltage of transistor 6 is always higher than the base voltage. The dividing ratio of resistor 23 and resistor 22 determine the gain factor of the amplifier circuit. The circuit means or connection 16 between output 14 and base 5 comprises a first resistor 24 which is included between the base 5 and the junction point 25 of an adjustable voltage divider 26, which divider is connected in parallel with a diode 27. Via the voltage divider 22, 23 this parallel arrangement is fed by the voltage source +E, which supplies a voltage which is positive relative to the output 14. Point 25 is biassed so that when the peak value to be detected is reached the base-emitter voltage between points 5 and 3 is substantially equal and, despite temperature variations, remains equal to the voltage between points 25 and 14.

The operation of the peak detector is as follows. When transistor 6 is cut off, capacitor 8 is charged in a positive sense by the current from source 9 having a direction 19. As a result of this the voltage at the output 14 of amplifier arrangement 10 also increases and capacitor 4 is charged to substantially the same voltage. As soon as this voltage becomes substantially equal to the most negative value of the input signal 28 at input 1-2, transistor 6 is turned on, the current from source 9 and a discharge current from capacitor 8 then forming the collector current. When the mean value of the charge applied when the transistor is cut off is equal to the mean value of the charge which is drained when the transistor is conductive, a balanced condition is obtained. The ripple voltage on capacitor 8 is determined by the value of this alternating charge and the capacitance value. Said ripple voltage increases as the frequencies of the input signal decrease owing to the long time interval between two peak values, in which interval capacitor 8 is charged by the current source 9. This ripple voltage also appears at output 15 and thus determines the accuracy of the peak-value measurement at low frequencies. At high frequencies the ripple voltage on capacitor 8 is not transferred, but it is the mean value of the capacitor voltage which determines the setting of the amplifier arrangement 10. The accuracy of the peak detector decreases as the ripple on capacitor 8 increases.

Figure 3:
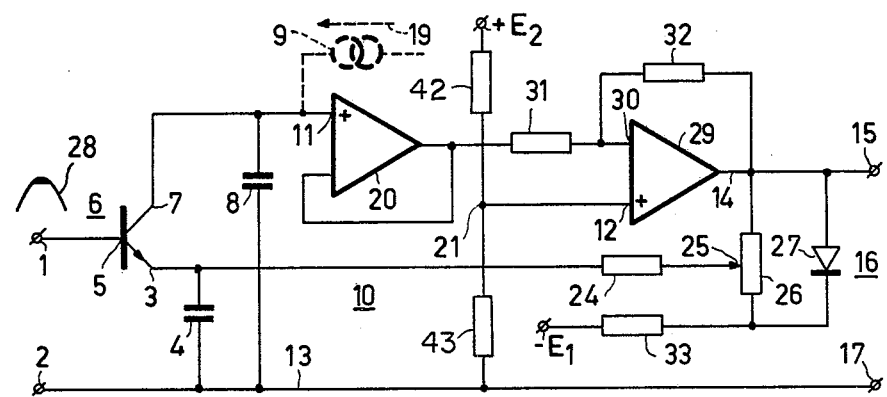
FIG. 3 represents a common-emitter npn-embodiment.

In the common-emitter arrangement of FIG. 3 positive-going maximum values of the input signal are measured by means of an npn-transistor. The amplifier arrangement 10 comprises a buffer amplifier 20, of which one input 11 is high-ohmic and is connected to the capacitor 8 and collector 7. The amplifier 29 is connected as an inverting amplifier. For this purpose the non-inverting input 12 is connected to a junction point 21 of a voltage divider 42-43 which is included between the ground connection 13 and a voltage source $+E_2$. The inverting input 30 is connected to the output of amplifier 20 via a resistor 31 and to the output 14 of amplifier 29 via a resistor 32. The parallel connection of diode 27 and voltage divider 26 is fed from a voltage source $-E_1$ via a resistor 33.

When transistor 6 is cut off capacitor 8 in this peak detector is also charged in a positive sense, but owing to the inversion in the amplifier arrangement 10 the capacitor 4 will be charged in a negative sense. As a result of this a maximum value in a positive sense of a signal 28 will be capable of making the base-emitter junction 5-3 of transistor 6 conduct.

In FIG. 4 transistor 6 is also included in a common-emitter arrangement. The transistor is of the pnp-type so that some polarities have changed in comparison with the peak detector of FIG. 3. The negativegoing peak values of signal 28 are measured and the current source 19 supplies a current in accordance with the direction of the arrow 18. The diode 27 has been connected with the opposite polarity so that the source $E_1$ now has a positive polarity relative to the output. In this circuit two changes have been proposed in comparison with the circuit of FIG. 3. First of all capacitor 8 is not connected directly to the ground connection 13, but instead via capacitor 4. For the high-frequency current this means that in this circuit the discharge current of capacitor 8 flows directly between this capacitor and the emitter-collector junction and that capacitor 4 only carries the input current in the circuit 2-4-3-5-1. By selecting the ratio between the capacitors 8 and 4 equal to the current gain factor $h_{fe}$ of transistor 6, the ripple voltages will be equal but of opposite sign. This means that no high-frequency ripple voltage is applied to input 11. This may be of significance for the amplifier arrangement 10, which is also shown in FIG. 4 and which only comprises one integrator. For this purpose the input 11 is connected to output 14 via a capacitor 36 and input 12 is connected to a voltage source $-E_2$. The integrator maintains a potential $-E_2$ on the collector of transistor 6 by controlling the output voltage on output 14 so that charging currents for capacitor 4, capacitor 8 and capacitor 36 in combination with the current from source 9 provide the correct voltage-distribution among capacitors 4 and 8.

The resistor 35 at the input has been included so as to enable a coaxial cable to be terminated with its characteristic impedance. The resistor 34 is low-ohmic and has been included in order to damp parasitic effects as a result of the non-ideal transistor.

What is claimed is:

1. A peak detector comprising, first and second input terminals for receiving an input voltage having a peak value, a voltage comparator circuit comprising a transistor having base, emitter and collector electrodes, means connecting said first input terminal to one of said emitter and base electrodes, a first capacitor operative as a storage element and connected to the other one of said emitter and base electrodes, a current source arrangement, a charging circuit coupled to said first capacitor and comprising an amplifier arrangement having a high-ohmic input connected to the collector electrode of said transistor and to said current source arrangement, a second capacitor connected to said collector electrode of the transistor, means coupling said first and second capacitors to the second input terminal and to a point of reference potential, said voltage comparator circuit being operative to compare said input voltage with the voltage across the first capacitor so as to control the charge on said first capacitor in a compensating sense if the capacitor voltage is not directly proportional to the input voltage peak value to be measured, and second means connecting an output of said amplifier arrangement to an output terminal of the peak detector and to said other one of said emitter and base electrodes.

2. A peak detector as claimed in claim 1 wherein said second connecting means comprises, first and second resistors, an adjustable voltage divider and a diode connected in parallel circuit and coupled between said output of the amplifier arrangement and via said second resistor to a source of reference voltage, means connecting said first resistor between said other one of said emitter and base electrodes and a junction point on said adjustable voltage divider so as to couple said amplifier output to said other one of said emitter and base electrodes, said source of reference voltage being of a polarity to forward bias the diode so as to compensate for any influence of the baseemitter voltage on the peak value measurement.

3. A peak detector as claimed in claim 1 wherein said one electrode of the transistor comprises the emitter and the other one of said base and emitter electrodes comprises the base electrode, and wherein the amplifier arrangement comprises a differential amplifier having a non-inverting input that constitutes said high-ohmic input and an inverting input connected to a junction point of a voltage divider connected between the output of the amplifier and a source of reference voltage, said amplifier output being the output of the peak detector.

4. A peak detector as claimed in claim 2, wherein said one electrode of the transistor comprises the base and the other one of said base and emitter electrodes comprises the emitter, the amplifier arrangement comprising a buffer amplifier and a differential amplifier connected in cascade with the input of the buffer amplifier constituting said high-ohmic input, means connecting an output of the buffer amplifier to an inverting input of the differential amplifier by means of a third resistor, and means connecting a non-inverting input of the differential amplifier to a further source of reference voltage and its output to the inverting input by means of a fourth resistor, said output of the differential amplifier being the output of the peak detector.

5. A peak detector as claimed in claim 2 wherein said one electrode of the transistor comprises the emitter electrode and the other one of said base and emitter electrodes comprises the base electrode, and wherein the amplifier arrangement comprises a differential amplifier having an non-inverting input that constitutes said high-ohmic input and an inverting input connected to a junction point of a voltage divider that includes said second resistor, said voltage divider being connected between the parallel circuit and said source of reference voltage, and said amplifier output being the output of the peak detector.

6. A peak detector as claimed in claim 2, wherein said one electrode of the transistor comprises the base electrode and the other one of said base and emitter electrodes comprises the emitter electrode, the amplifier arrangement comprising a differential amplifier having a non-inverting input connected to a further source of reference voltage and an inverting input coupled said high-ohmic input, said amplifier output being the output of the peak detector.

7. A peak detector comprising first and second input terminals for receiving an input signal to be detected, a voltage comparator circuit including a single transistor having a base-emitter junction and a collector, means coupling the first input terminal to one terminal of said base-emitter junction, a first capacitor coupled to the other terminal of said base-emitter junction and to the second input terminal, a current source, an amplifier having a high-ohmic input and an output terminal, circuit means coupling said output terminal to said other terminal of the transistor base-emitter junction, and a second capacitor having a first terminal coupled to the second input terminal and a second terminal coupled to the transistor collector, the current source, and the amplifier high-ohmic input so that said second capacitor is charged by the current source when the transistor is cut-off and said second capacitor and current source supply transistor collector current after the transistor turns on, said voltage comparator circuit being operative to compare an input signal with a voltage across the first capacitor so as to control the charge on said first capacitor in a compensating sense if the capacitor voltage is not directly proportional to the peak value of the input signal whereby any high frequency currents only flow in the transistor and the first and second capacitors and the amplifier provides a DC negative feedback voltage via the circuit means.

8. A peak detector comprising, first and second input terminals for receiving an input voltage having a peak value, a voltage comparator circuit comprising a transistor having base, emitter and collector electrodes, means connecting said first input terminal to said base electrode, a first capacitor operative as a storage element, a current source arrangement, a charging circuit coupled to said first capacitor and comprising an amplifier arrangement having a high-ohmic input connected to the collector electrode of said transistor and to said current source arrangement, a second capacitor, means connecting the second capacitor between the collector electrode and the emitter electrode of the transistor, means coupling the first capacitor to the emitter electrode and to the second input terminal and to a point of reference potential, said voltage comparator circuit being operative to compare said input voltage with the voltage across the first capacitor so as to control the charge on said first capacitor in a compensating sense if the capacitor voltage is not directly proportional to the input voltage peak value to be measured, and second means connecting an output of said amplifier arrangement to an output terminal of the peak detector and to said emitter electrode of the transistor.

9. A peak detector as claimed in claim 8, wherein, the amplifier arrangement comprises a differential amplifier having a non-inverting input connected to a source of reference voltage and an inverting input constituting said high-ohmic input, and means coupling a third capacitor between said inverting input and an output of the amplifier, said amplifier output being the output of the peak detector.

* * * * *